(12) United States Patent
Hara et al.

(10) Patent No.: US 7,095,480 B2
(45) Date of Patent: Aug. 22, 2006

(54) COOLING APPARATUS

(75) Inventors: Shinichi Hara, Kanagawa (JP); Eiji Sakamoto, Tochigi (JP); Yoshinori Miwa, Tochigi (JP); Yasuo Hasegawa, Tochigi (JP); Yoshiki Kino, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 106 days.

(21) Appl. No.: 10/779,214

(22) Filed: Feb. 13, 2004

(65) Prior Publication Data
US 2004/0174504 A1    Sep. 9, 2004

(30) Foreign Application Priority Data
Feb. 13, 2003   (JP) .............................. 2003-034449

(51) Int. Cl.
*G03B 27/42*    (2006.01)

(52) U.S. Cl. ........................... 355/30; 355/53; 355/67; 355/71; 250/492.2; 250/548

(58) Field of Classification Search .................... None
See application file for complete search history.

(56) References Cited

U.S. PATENT DOCUMENTS

| 6,594,334 B1 * | 7/2003 | Ota .............................. 378/34 |
| 6,806,897 B1 * | 10/2004 | Kataoka et al. ............. 347/256 |
| 2004/0051984 A1 * | 3/2004 | Oshino et al. .............. 359/845 |
| 2005/0122490 A1 * | 6/2005 | Luttikhuis et al. ............ 355/30 |

* cited by examiner

*Primary Examiner*—D. Rutledge
(74) *Attorney, Agent, or Firm*—Morgan & Finnegan, LLP

(57) ABSTRACT

A cooling apparatus arranged in a vacuum or reduced pressure atmosphere for use with an optical element having an illuminated area onto which light is irradiated concave part includes a temperature variation mechanism that changes a temperature of part of the cooling apparatus in a non-contact manner.

1 Claim, 12 Drawing Sheets

COOLING APPARATUS

This application claims a benefit of priority based on Japanese Patent Application No. 2003-034449, filed on Feb. 13, 2003, which is hereby incorporated by reference herein in its entirety as if fully set forth herein.

BACKGROUND OF THE INVENTION

The present invention relates to a cooling apparatus, and more particularly to a cooling apparatus for cooling an optical element in an exposure apparatus that exposes an object, such as a single crystal substrate and a glass plate for a liquid crystal display ("LCD"). The present invention is suitable, for example, for an exposure apparatus that uses ultraviolet ("UV") and extreme ultraviolet ("EUV") light as an exposure light source.

Reduction projection exposure apparatus have been conventionally employed which use a projection optical system to project a circuit pattern formed on a mask or a reticle onto a wafer, etc. to transfer the circuit pattern, in manufacturing such fine semiconductor devices as semiconductor memories and logic circuits in photolithography technology.

The minimum critical dimension ("CD") to be transferred by the projection exposure apparatus or resolution is proportionate to a wavelength of light used for exposure, and inversely proportionate to the numerical aperture ("NA") of the projection optical system. The shorter the wavelength is, the better the resolution is. Recent demands for finer semiconductor devices have promoted a shorter wavelength of ultraviolet light from an ultra-high pressure mercury lamp (i-line with a wavelength of approximately 365 nm) to KrF excimer laser (with a wavelength of approximately 248 nm) and ArF excimer laser (with a wavelength of approximately 193 nm).

However, the lithography using the ultraviolet light has the limit to satisfy the rapidly progressing fine processing of semiconductor devices, and a reduction projection optical system using EUV light with a wavelength of 10 to 15 nm shorter than that of the ultraviolet (referred to as an "EUV exposure apparatus" hereinafter) has been developed for efficient transfers of very fine circuit patterns.

Due to the remarkably increasing light absorption in a material with the shorter wavelength of the exposure light, it is difficult to use refraction elements or lenses for visible light and ultraviolet light. No glass material is viable to a wavelength range of the EUV light, and a reflection-type or catoptric optical system uses only a reflective element or mirror, such as a multilayer mirror.

A mirror does not reflect all the exposure light, but absorbs the exposure light of 30% or greater. The absorbed exposure light causes residual heat, deforms a surface shape of the mirror, and deteriorates its optical performance, in particular, imaging performance. Thus, the mirror is made of a low thermal expansion glass, for example, having a coefficient of linear expansion of 10 ppb, so as to reduce a mirror's shape change as the temperature changes.

Since the EUV exposure apparatus is used to expose circuit patterns of 0.1 μm or smaller and required to meet very high critical dimension accuracy, only a deformation of about 0.1 nm or smaller is permissible on the mirror surface. When the mirror has a coefficient of linear expansion of 10 ppb, the mirror surface deforms as the temperature rises and the mirror surface shape changes by 0.1 nm when the temperature rises by 0.2° C.

Accordingly, as shown in FIG. 14, the instant assignee has already proposed to arrange a radiation plate RP on a rear surface MN opposite to the front (reflective) surface MR of a mirror M that reflects exposure light EL, and to cool the mirror M through radiation (see Japanese Patent Application No. 2002 -222911). FIG. 14 is a schematic structure showing one exemplary cooling method for the mirror M.

There has not been proposed, for example, a temperature adjustment for mitigating a temperature distribution among an illuminated area IE and a non-illuminated area NIE on the mirror M's reflective surface MR, and a rear surface IB of the illuminated area IE, and for maintaining the mirror M at a reference temperature. Therefore, the reflective surface MR of the mirror M thermally deforms due to the temperature distribution inside the mirror M, changes its curvature between the original reflective surface MR and the thermally deformed reflective surface MR', as shown in FIG. 15, and deteriorating the imaging performance. FIG. 15 is a schematic structure showing a thermally deformed curvature of the mirror M.

In addition, only the mirror's improved internal temperature distribution is insufficient. If the mirror cannot be maintained at the reference temperature, the temperature variance changes a mirror position and deteriorates mirror's optical performance.

BRIEF SUMMARY OF THE INVENTION

Accordingly, it is an exemplified object of the present invention to provide a cooling apparatus that improves an internal temperature distribution in an optical element, maintains the optical element at a reference temperature, and reduces a deformation of the optical element caused by a thermal expansion, which deterioration deteriorates imaging performance.

A cooling apparatus of one aspect according to the present invention arranged in a vacuum or reduced pressure atmosphere for use with an optical element having an illuminated area onto which light is irradiated concave part includes a temperature variation mechanism that changes a temperature of part of the cooling apparatus in a non-contact manner.

The temperature variation mechanism may include a cooling mechanism that does not contact the optical element, and cools the illuminated area of the optical element. The cooling mechanism may absorb heat from the optical element through radiation. The cooling mechanism may include a detector for detecting a temperature of the optical element, a radiation plate for forming a temperature difference so that the radiation plate has a temperature lower than the illuminated area of the optical element, and a controller for controlling the temperature of the radiation plate so that the temperature of the optical element detected by the detector can be a predetermined value.

The radiation plate may have a channel for a heating medium to flow through, wherein the cooling apparatus further comprises a circulation part, controlled by the controller, for circulating the heating medium in the channel.

The cooling apparatus may further include a Peltier element, connected to the radiation plate, for cooling the radiation plate through a Peltier effect, a radiation block that has a channel for a heating medium to flow through, and recovers exhaust heat from the Peltier element, and a circulation part for circulating the heating medium in the channel. The radiation plate may face the illuminated area on the optical element. The radiation plate may form an angle at 90° or smaller relative to the illuminated area on the optical element.

The cooling mechanism may include a radiation plate for forming a temperature difference so that the radiation plate has a temperature lower than the illuminated area of the optical element, a detector for detecting a temperature of the radiation plate, and a controller for controlling the temperature of the radiation plate so that the temperature of the radiation plate detected by the detector can be a predetermined value.

The cooling apparatus may further include a radiation shielding part that faces a non-illuminated area other than the illuminated area of the optical element, and shields radiation to the non-illuminated area. The radiation shielding part may have an emissivity of 0.2 or smaller. The radiation shielding part may be a film formed on the non-illuminated area.

The temperature variation mechanism may include a cooling mechanism, provided in non-contact with the optical element, for cooling the optical element, and a heating mechanism, provided in non-contact with the optical element, for heating at least part of a non-illuminated area on the optical element other than the illuminated area.

The heating mechanism may heat the non-illuminated area on the optical element through radiation. The heating mechanism may heat a rear surface of the illuminated area on the optical element. The heating mechanism may include a detector for detecting a temperature of the optical element, a radiation plate for forming a temperature difference so that the radiation plate has a temperature higher than the illuminated area of the optical element, and a controller for controlling the temperature of the radiation plate so that the temperature of the optical element detected by the detector can be a predetermined value.

The heating mechanism may include a radiation plate for forming a temperature difference so that the radiation plate has a temperature higher than the illuminated area of the optical element, a detector for detecting a temperature of the radiation plate, and a controller for controlling the temperature of the radiation plate so that the temperature of the radiation plate detected by the detector can be a predetermined value.

The radiation plate has a channel for a heating medium to flow through, wherein the cooling apparatus further comprises a circulation part, controlled by the controller, for circulating the heating medium in the channel. The cooling apparatus may further include a Peltier element, connected to the radiation plate, for cooling the radiation plate through a Peltier effect, a radiation block that has a channel for a heating medium to flow through, and recovers exhaust heat from the Peltier element, and a circulation part for circulating the heating medium in the channel. The cooling apparatus may further include a heater, controlled by the controller and connected to the radiation plate, for heating the radiation plate.

The cooling mechanism may include a radiation plate, provided opposite to a rear surface of the illuminated area on the optical element, for forming a temperature difference so that the radiation plate has a temperature lower than the illuminated area on the optical element. The cooling mechanism may include a radiation plate, provided opposite to the illuminated area on the optical element, for forming a temperature difference so that the radiation plate has a temperature lower than the illuminated area on the optical element. The cooling mechanism may include a radiation plate, angled at 90° or smaller relative to the illuminated area on the optical element, for forming a temperature difference so that the radiation plate has a temperature lower than the illuminated area on the optical element. The heating mechanism may include a radiation plate, opposite to a rear surface of the illuminated area on the optical element, for forming a temperature difference so that the radiation plate has a temperature higher than the illuminated area on the optical element. The radiation plate may include a first part that has an emissivity of 0.8 or greater, and a second part that has an emissivity of 0.2 or smaller.

An exposure apparatus includes the above cooling apparatus, and an optical system that includes the optical element cooled by the cooling apparatus and exposes a pattern on a mask onto an object via the optical element. The exposure apparatus may use light having a wavelength of 20 nm or smaller to exposure the object.

A device fabricating method of another aspect of the present invention includes the steps of exposing an object using the above exposure apparatus, and developing the exposed object. Claims for a device fabricating method for performing operations similar to that of the above exposure apparatus cover devices as intermediate and final products. Such devices include semiconductor chips like an LSI and VLSI, CCDs, LCDs, magnetic sensors, thin film magnetic heads, and the like.

Other objects and further features of the present invention will become readily apparent from the following description of the preferred embodiments with reference to accompanying drawings.

DETAILED DESCRIPTION OF THE PREFERRED EMBODIMENTS

Figure 1:
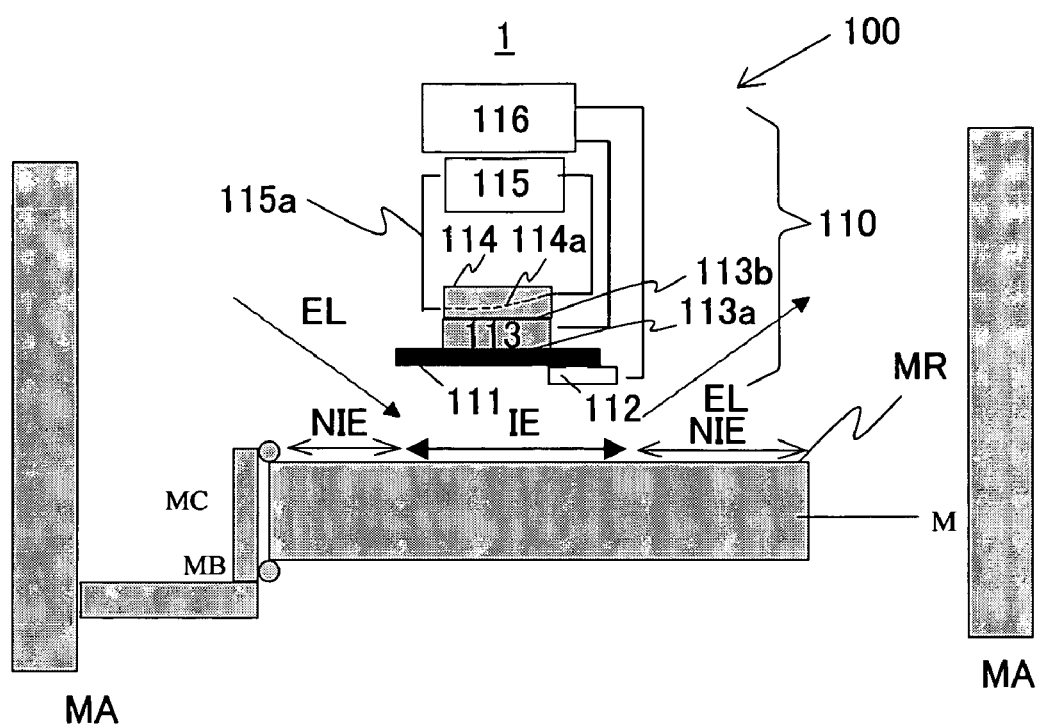
FIG. 1 is a schematic structure of a cooling apparatus of one aspect according to the present invention.

Referring now to accompanying drawings, a description will be given of a cooling apparatus 1 and an exposure apparatus 100 of one embodiment according to the present invention. Like elements in respective views are designated by like reference numerals, and a description thereof will be omitted. Here, FIG. 1 is a schematic structure of cooling apparatus 1.

The cooling apparatus 1 is one for cooling an optical element M provided in a vacuum chamber VC. A vacuum pump (not shown) maintains the chamber VC to be high vacuum, for example, about $1 \times 10^6$ [Pa] by so that a reaction between the residual gas component in the exposure optical path, such as polymer organic gas, and exposure light EL may not contaminate the optical member M's surface and lower its transmittance and reflectance.

The optical element M is supported by a mirror barrel MA and positioned at a predetermined position by a clamp member MC via a support member MB in the chamber VC. The optical member M images light using reflection, refraction, diffraction, etc. The optical element M includes, for example, a mirror, a lens, a parallel plate glass, a prism, a Fresnel zone plate, a kinoform, a binary optics, a hologram, and other diffraction optical elements. The instant embodiment describes the optical element M as a mirror.

FIG. 1 characteristically shows the mirror barrel MA that partially encloses one optical element M, the support member MB that supports the optical element M, and the clamp member MC that clamps the optical element M. The clamp member MC supports the optical element M at three points using an air-pressure actuator, such as an air cylinder. The support member MB supports the mirror barrel MA, and uses, for example, a kinematic mount to properly restrict the optical element M (with six degrees of freedom) which has been three-point-supported by the clamp member MC at a predetermined position.

The cooling apparatus 1 includes, as best shown in FIG. 1, a cooling mechanism 100 as a temperature variation mechanism 100. The temperature variation mechanism 100 locally changes a temperature of the optical element M in a non-contact manner.

The cooling mechanism 110 is arranged so that it does not contact the optical element M or shield the exposure light EL. The cooling mechanism 110 absorbs the heat from the optical element M through radiation. The cooling mechanism 110 includes a radiation plate 111, a detector 112, a Peltier element 113, a radiation block 114, a circulation part 115, and a controller 116.

The radiation plate 111 is arranged apart by an interval from an illuminated area IE on a reflective surface MR of the optical element M through a radiation-plate support member supported by a radiation-plate support stool (not shown). This interval is preferably short to improve the heat absorption efficiency from the illuminated area IE of the optical element M.

The radiation plate 111 is connected to the Peltier element 113, which will be described later, and cooled by the Peltier effect by the Peltier element 113 so that the radiation plate 111 has a temperature lower than that of the optical element M and forms a temperature difference with the optical element M. In other words, the radiation plate 111 absorbs the heat from the optical element M through radiation due to the temperature difference with the optical element M. The radiation plate 111 is made of a material having comparatively good heat conductivity and high emissivity, such as aluminum nitride of ceramics (AlN).

The detector 112 is attached to the radiation plate 111, and detects the temperature of the radiation plate 111. The detector 112 is adapted to send the detected temperature of the radiation plate 111 to the controller 116, which will be described later. The detector 112 includes a temperature sensor, such as a thermocouple, a resistor temperature sensor, and an infrared temperature sensor. While the detector 112 is attached to or contacts the radiation plate 111 in the instant embodiment, the detector 112 may be provided apart from the radiation plate 111 and detect the temperature of the radiation plate 111 in a non-contact manner.

The Peltier element 113 forms a temperature difference between a heat absorbing surface 113a and a heat radiating surface 113b when electrified. The temperature of the heat absorbing surface 113a can be reduced by maintaining the temperature of the heat radiating surface 113b approximately constant using the radiation block 114, which will be described later. A joint of the Peltier element 113's heat absorbing surface 113a with the heat radiation plate 111 would be able to absorb the heat from and cool the heat radiation plate 111. The Peltier element 113 is so responsive that it can control the temperature of the radiation plate 111 and maintain the temperature of the optical element M to a predetermined value.

The radiation block 114 is jointed with the heat radiation surface 113a of the Peltier element 113, and has a channel 114a that flows coolant supplied by the circulation part 115, which will be described later. The channel 114a is connected to the circulation part 115 via a pipe 115a. The channel 114a is formed in the radiation block 114, so that the radiation block 114 can be entirely and uniformly cooled. The radiation block 114 is cooled by the coolant, and recovers the heat exhausted by the heat radiation surface 113b of the Peltier element 113.

The circulation part 115 is connected to the pipe 115a, supplies to the channel 114a in the radiation block 114 via the pipe 115a, and circulates the coolant through the channel 114a. The coolant supplied by the circulation part 115 to the channel 114a and flowed through the channel 114a is to recover the heat from the radiation block 114.

The controller 116 controls the cooling mechanism 110 so that the temperature of the radiation plate 111 detected by the detector 112 may have the predetermined value. More specifically, the controller 116 controls the temperature of the radiation plate 111 by changing the voltage applied to the Peltier element 113. In other words, the controller 116 calculates the heat amount to be absorbed by the radiation plate 111, and determines the temperature of the radiation plate 111 based on this heat amount. Moreover, the controller 116 adjusts the voltage applied to the Peltier element 113 based on the determined temperature of the radiation plate 111. This control adjusts the heat amount absorbed by the radiation plate 111 from the optical element M.

For example, heat flow velocity density Q as the heat value which a material Y having absolute temperature $T_2$ [K] and area $A_2$ [m$^2$] absorbs from a material X having absolute temperature $T_1$ [K] and area $A_1$ [m²] is given by the following equation where $E_1$ is emissivity of the material X, $E_2$ is emissivity of the material Y, $F_{12}$ is radiation mode coefficient (or a ratio of energy which has been emitted from the material X and reached the material Y), $T_1>T_2$, and $5.67\times 10^{-8}$ is Stefan-Boltzmann constant:

$$Q=5.67\times10^{-8}\times(T_1^4-T_2^4)/((1-E_1)/(E_1\times A_1)+(1/(A_2\times F_{12}))+(1-E_2)/(E_2\times A_2))$$

In other words, the radiation can provide or absorb more heat through the radiation as the radiation mode coefficient, area and emissivity become larger.

Since the radiation plate 111 is arranged near and opposite to an illuminated area IE or an area on a reflective surface MR of the optical element M, onto which the exposure light EL is irradiated, the radiation mode coefficients of the radiation plate 111 and the illuminated area IE of the optical element M are larger than the radiation mode coefficient of the other non-illuminated area NIE, providing a local heat absorption from the illuminated area IE.

This configuration results in the reduced temperature rise in the illuminated area IE as a result of that the optical element M absorbs the exposure light EL, and a smaller temperature difference with the non-illuminated area NIE. Thereby, the optical element M has a less variable surface shape, such as curvature, and less deteriorated imaging performance.

The instant embodiment detects the temperature of the radiation plate 111, and provides control so that the detected temperature of the radiation plate 111 is maintained constant. Alternative control may use the detector 112 jointed with the optical element M, and maintain the temperature of the optical element M constant.

Due to a close correlation between a surface shape of the optical element M and the temperature of the optical element M, the optical element M has a less variable surface shape, such as curvature, and less deteriorated imaging performance.

Figure 2:
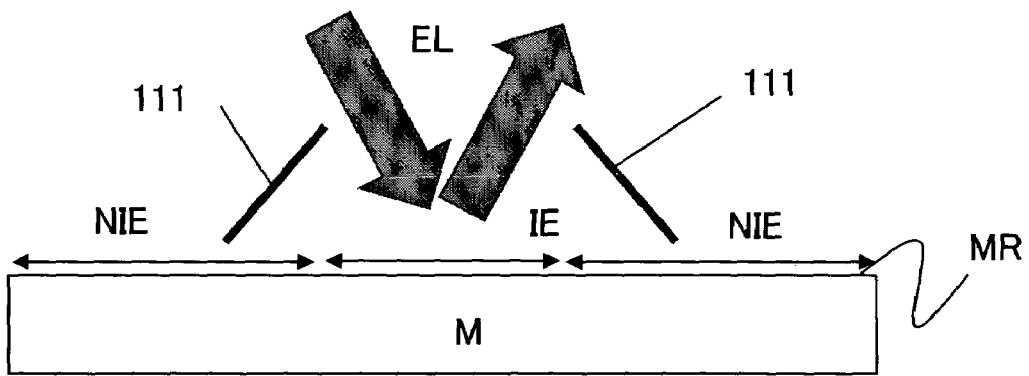
FIG. 2 is a schematic view of principal part in one exemplary arrangement of a radiation plate when the radiation plate cannot be located at a position opposite to and near an illuminated area on an optical element.

When the radiation plate 111 cannot be arranged near and opposite to the illuminated area IE of the optical element M, the radiation plate 111 may face the illuminated area IE of the optical element M, as shown in FIG. 2. When the radiation plate 111 is arranged like a cone shape to enclose the illuminated area IE, the radiation plate 111 preferably has a larger area opposite to the illuminated area IE and absorbs more heat through radiation. Here, FIG. 2 is a schematic view of principal part in one exemplary arrangement of the radiation plate 111 when the radiation plate 111 cannot be located at a position opposite to and near an illuminated area IE on an optical element M.

Figure 3:
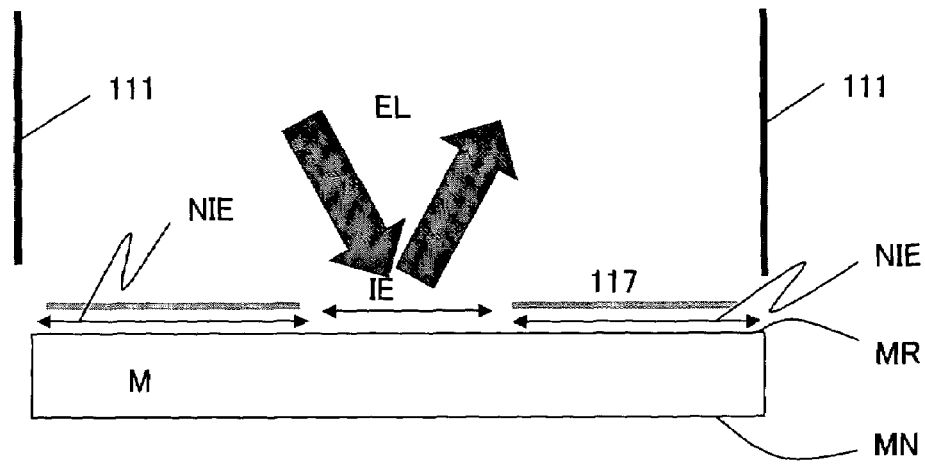
FIG. 3 is a schematic view of principal part of one exemplary cooling apparatus when a radiation shielding part is provided near a non-illuminated area on the optical element.

Even when the temperature drops in the illuminated area IE of the optical element M, the temperature lowers in the non-illuminated area NIE and the optical element M cannot reduce or eliminate a temperature difference between the illuminated and non-illuminated areas IE and NIE, if the radiation plate 111 absorbs the heat from the non-illuminated area NIE through radiation. In this case, as shown in FIG. 3, the radiation plate 111 is arranged to enclose the optical element M, and a radiation shielding part 117 having an emissivity of 0.2 or smaller is arranged opposite to the non-illuminated area NIE on the reflective surface MR of the optical element M. The low emissivity of the radiation shielding part 117 prevents the radiation from the non-illuminated area NIE of the optical element M. The radiation shielding part 117 may be a plate that has been temperature-controlled by the above Peltier element and the heat medium, similar to the optical element M. A small temperature difference from the optical element can prevent radiation. In this case, the radiation plate 111 may be arranged at a position that can cool the illuminated area IE through radiation instead of arranging the radiation plate 111 near the illuminated area IE on the optical element M. For example, the radiation plate 111 can be held by the inside of the mirror barrel MA or the mirror barrel MA can serve as the radiation plate 111 by supplying a medium for adjusting the temperature of the mirror barrel MA. Of course, the radiation shielding part 117 provided to the cooling apparatus 1 shown in FIGS. 1 and 2 can provide similar effects. Here, FIG. 3 is a schematic view of principal part of the cooling apparatus 1 when the radiation shielding part 117 is provided near the non-illuminated area NIE on the optical element M.

Figure 4:
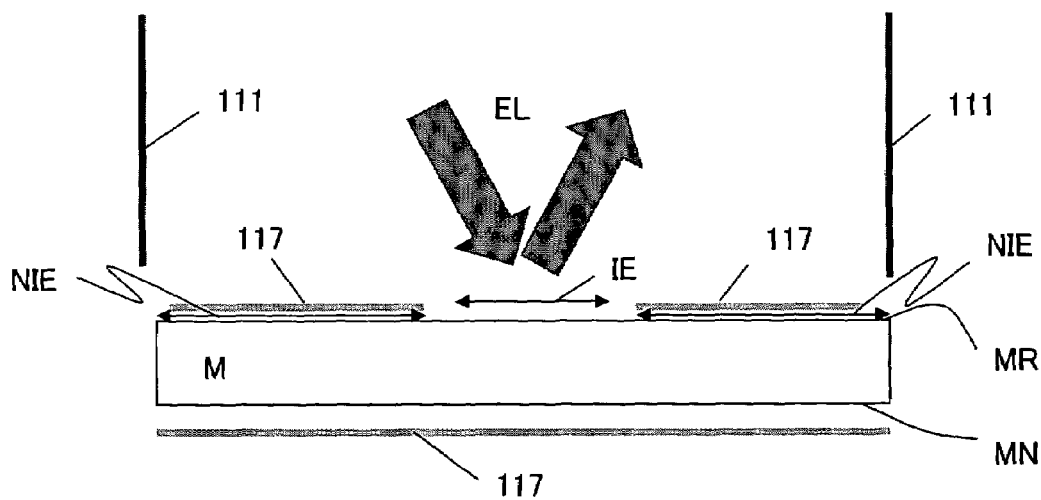
FIG. 4 is a schematic view of principal part of one exemplary cooling apparatus when a radiation shielding part is provided near a rear surface corresponding to a non-illuminated area on the reflective surface on the optical element.

As shown in FIG. 4, the radiation shielding part 117 provided at a position opposite to a rear surface MN of the reflective surface of the optical element M can prevent radiation from the rear surface MN of the reflective surface of the optical element M, and reduces the temperature difference between the illuminated and non-illuminated areas IE and NIE on the optical element M. Thereby, the optical element M has a less variable surface shape, such as curvature, and less deteriorated imaging performance. Here, FIG. 4 is a schematic view of principal part of the cooling apparatus 1 when the radiation shielding part 117 is provided near the rear surface MN corresponding to the non-illuminated area NIE on the reflective surface MR on the optical element M.

For similar effects, the radiation shielding part 117 may form an additional film with emissivity of 0.2 or smaller on the rear surface MN of the reflective surface MR on the optical element M corresponding to its non-illuminated area NIE. This configuration is advantageous when there is little space for the radiation shielding part 117.

As discussed, the cooling apparatus 1 can provide control over the temperature of the radiation plate 111 so that the radiation plate 111 or the optical element M may have the constant temperature. This is because the optical element M comes to have excellent imaging performance when its temperature is appropriately controlled to the predetermined best temperature required for the excellent imaging performance.

The predetermined temperature of the radiation plate 111 which provides the best temperature for the optical element M would provide the optical element M with the excellent imaging performance, if the radiation plate 111 is constantly temperature-controlled at this temperature.

The cooling apparatus 1 can maintain the temperature of the optical element M constant even by maintaining the temperature of the radiation plate 111 constant, when reducing the temperature difference between the illuminated and non-illuminated areas IE and NIE on the optical element M, or when controlling the temperature of the radiation plate 111 so that the optical element M has the constant temperature. In addition, the cooling apparatus 1 can maintain the temperature of the optical element M constant even by maintaining the temperature of the radiation plate 111 constant, when the thermal load is almost constant, since the thermal load applied to the optical element M is equivalent to the heat amount removable by the radiation plate 111. Thus, it is possible to reduce positional variances of not only the reflective surfaces MR on the optical element M as the average temperature of the optical element M rises but also the optical element M as the temperatures of the support member MB rises.

While the instant embodiment uses the Peltier element 113 to cool the radiation plate 111, the radiation plate 111 may be provided with a channel and coolant may be flowed through the channel to maintain the radiation plate 111 at a low temperature. Thereby, the cooling mechanism 110 can be made smaller than that using the Peltier element 113, although the radiation plate 111 has reduced temperature stability.

Figure 5:
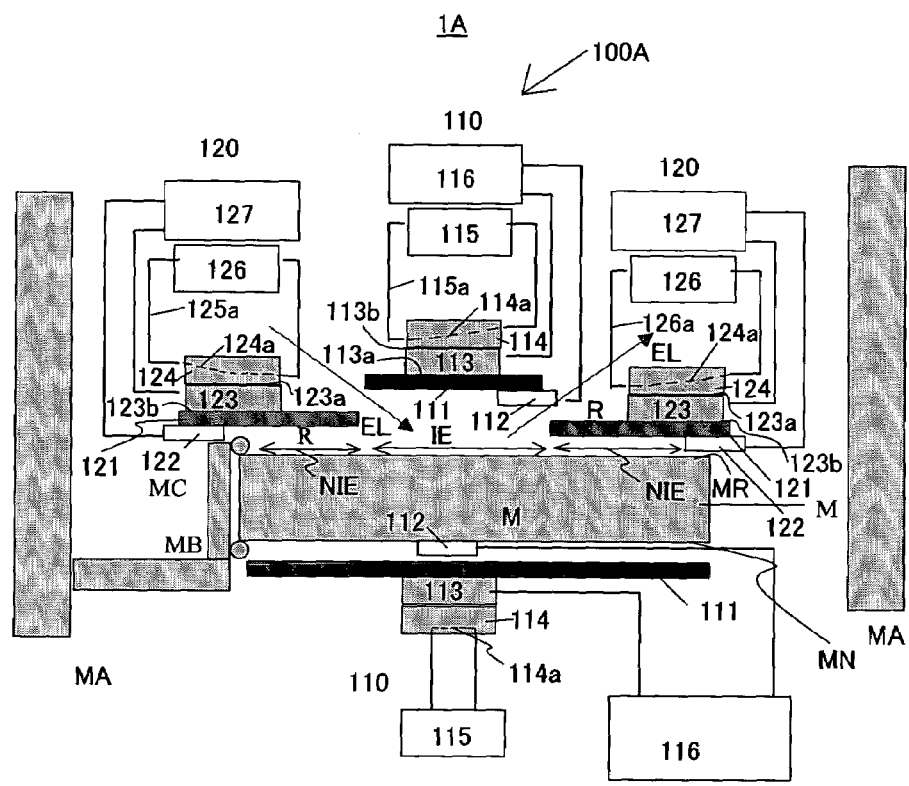
FIG. 5 is a variation of the cooling apparatus shown in FIG. 1.
Figure 6:
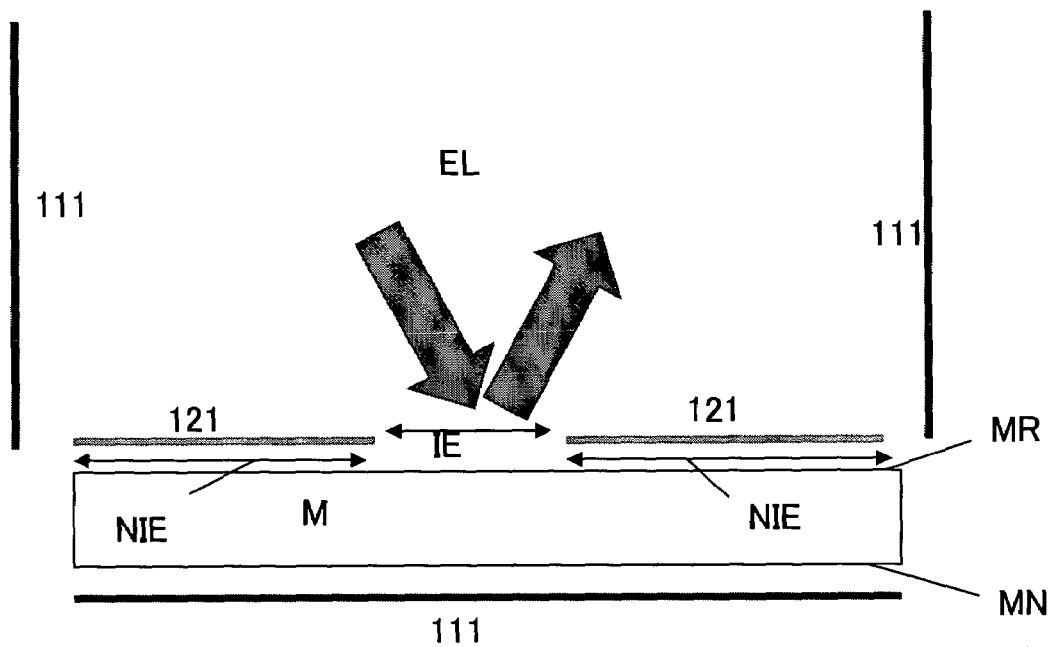
FIG. 6 is a schematic view of principal part in one exemplary arrangement of a radiation plate in the cooling apparatus shown in FIG. 5 at the side of a reflective surface of an optical element when the radiation plate cannot be located at a position opposite to and near an illuminated area on the optical element.

Referring now to FIGS. 5 and 6, a description will be given of a cooling apparatus 1A as a variation of the cooling apparatus 1. The cooling apparatus 1A has a temperature variation mechanism 100A different from that in the cooling apparatus 1. More specifically, the cooling apparatus 1A absorbs the heat from the illuminated area IE of the optical element M, provides the heat to the non-illuminated area IE on the optical element M, reducing a temperature difference between the illuminated and non-illuminated areas IE and NIE. Here, FIG. 5 is a schematic structure of the cooling apparatus 1A.

The cooling apparatus 1A includes, as best shown in FIG. 5, a cooling mechanism 110 and a heating mechanism 120 as a temperature variation mechanism 100A. The temperature variation mechanism 100 locally changes a temperature of the optical element M in a non-contact manner.

The cooling mechanism 110 is arranged so that it does not contact the optical element M or shield the exposure light EL. The cooling mechanism 110 absorbs the heat from the optical element M (particularly from the illuminated area IE) through radiation.

The heating mechanism 120 is arranged so that it does not contact the optical element M or shield the exposure light EL. The heating mechanism 120 provides the heat to the optical element M through radiation. The heating mechanism 120 includes a radiation plate 121, a detector 122, a Peltier element 123, a radiation block 124, a circulation part 125, and a controller 126.

The radiation plate 121 is arranged apart by an interval from the non-illuminated area NIE on the reflective surface MR of the optical element M through a radiation-plate support member supported by a radiation-plate support stool (not shown). This interval is preferably short to improve the heat absorption efficiency from the non-illuminated area NIE of the optical element M.

The radiation plate 121 is connected to the Peltier element 123, which will be described later, and heated by the Peltier effect by the Peltier element 123 so that the radiation plate 121 has a temperature higher than the non-illuminated area NIE of the optical element M and forms a temperature difference with the optical element M. In other words, the radiation plate 121 provides the heat to the non-illuminated area NIE on the optical element M through radiation due to the temperature difference with the non-illuminated area NIE on the optical element M. The radiation plate 121 is made of a material having comparatively good heat conductivity and high emissivity, such as aluminum nitride of ceramics (AlN).

The detector 122 is attached to the radiation plate 121, and detects the temperature of the radiation plate 121. The detector 122 is adapted to send the detected temperature of the radiation plate 111 to the controller 126, which will be described later. The detector 122 includes a temperature sensor, such as a thermocouple, a resistor temperature sensor, and an infrared temperature sensor. While the detector 122 is attached to or contacts the radiation plate 121 in the instant embodiment, the detector 122 may be provided apart from the radiation plate 121 and detect the temperature of the radiation plate 121 in a non-contact manner.

The Peltier element 123 forms a temperature difference between a heat absorbing surface 123a and a heat radiating surface 123b when electrified. The temperature of the heat absorbing surface 123a can be raised by maintaining the temperature of the heat radiating surface 123b approximately constant using the radiation block 124, which will be described later. A joint of the Peltier element 123's heat absorbing surface 123a with the heat radiation plate 121 would be able to radiate the heat from the heat radiation plate 121 and heat the non-illuminated area NIE. The Peltier element 123 is so responsive that it can control the temperature of the radiation plate 121 and maintain the temperature of the non-illuminated area NIE on the optical element M to a predetermined value.

The radiation block 124 is jointed with the heat absorbing surface 123a of the Peltier element 123, and has a channel 124a that flows a heating medium supplied by the circulation part 125, which will be described later. The channel 124a is connected to the circulation part 125 via a pipe 125a. The channel 124a is formed in the radiation block 124, so that the radiation block 124 can receive the heating medium entirely and uniformly. The radiation block 124 is heated by the heating medium, and provides the heat to the heat absorbing surface 123a of the Peltier element 123.

The circulation part 125 is connected to the pipe 115a, supplies to the channel 124a in the radiation block 124 via the pipe 125a, and circulates the heating medium through the channel 124a. The heating medium supplied by the circulation part 125 to the channel 124a and flowed through the channel 124a is to heat the radiation block 124.

The controller 126 controls the heating mechanism 120 so that the temperature of the radiation plate 121 detected by the detector 122 may have a predetermined value. More specifically, the controller 126 controls the temperature of the radiation plate 121 by changing the voltage applied to the Peltier element 123. In other words, the controller 126 calculates the heat amount to be provided to the non-illuminated area NIE on the optical element M, and determines the temperature of the radiation plate 121 based on this heat amount. Moreover, the controller 116 adjusts the voltage applied to the Peltier element 123 based on the determined temperature of the radiation plate 121. This control adjusts the heat amount provided to the non-illuminated area NIE on the optical element M.

The cooling apparatus 1A uses the heating mechanism 120 to heat the non-illuminated area NIE of the optical element M and to reduce the temperature difference from the illuminated area IE on the optical element M. Thereby, the optical element M has a less variable surface shape, such as curvature, and less deteriorated imaging performance. As shown in FIG. 5, the cooling apparatus 1A uses the cooling mechanism 110 to cool the illuminated area IE on the optical element M, and to reduce the temperature difference between the illuminated and non-illuminated areas IE and NIE on the optical element M. Thereby, the optical element M has a less variable surface shape.

The instant embodiment arranges the cooling mechanism 110 near the rear surface MN of the reflective surface MR on the optical element M, reduces the temperature distribution towards the inside of the optical element M and maintains, at a desired temperature, the temperature of the optical element M. The optical element M that is maintained at the desired temperature improves its positional stability and its optical performance.

The large area radiation plate 111 can be arranged for the reflective surface MR on the optical element M, since there is no interference with the heating mechanism 120 unlike the reflective surface MR. Thus, more heat amount can be absorbed from the optical element M. Therefore, the optical element M can be cooled to a desired temperature, even when the absorbed heat amount caused by an irradiation of light is large. The desired temperature is, for example, a temperature of the mirror barrel MA. A coincidence between the mirror barrel MA's temperature and the optical element M's temperature can prevent the deterioration in optical performance, which results from the positional variances of the optical element M when the temperatures of the support member MB and the clamp member MC vary.

The instant embodiment joints the detectors 112 and 122 with the radiation plates 111 and 121 for the reflective surface MR on the optical element M to maintain constant the detected temperature of the radiation plates 111 and 121. In addition, the instant embodiment joints the detector 112 with the radiation plate 111 for the rear surface MN of the reflective surface MR on the optical element M to control the temperature of the radiation plate 111 so as to maintain constant the detected temperature of the optical element M. Alternatively, all of the radiation plates may be controlled so that their temperatures become constant, or all or part of the radiation plates may be controlled so that the temperature of the optical element becomes constant. This is because the optical element M comes to have excellent imaging performance when its temperature is appropriately controlled to the predetermined best temperature required for the excellent imaging performance.

The predetermined temperature of the radiation plates 111 and 121 which provides the best temperature for the optical element M would provide the optical element M with the excellent imaging performance, if the radiation plates 111 and 121 are constantly temperature-controlled at this temperature. There is a close correlation between a surface shape of the optical element M and the temperature of the optical element M. Therefore, if the radiation plates 111 and 121 are temperature-controlled so that the optical element M has the constant temperature, the optical element M comes to have a less variable surface shape, such as curvature, and less deteriorated imaging performance. It is easy to detect the temperature of these radiation plates 111 and 121 rather than detecting the temperature of the optical element M for mounting convenience. This is because a contact-type temperature sensor that can accurately detect temperature does not have to be jointed with the optical element M that should be precisely positioned.

The cooling apparatus 1A can maintain the temperature of the optical element M constant even by maintaining the temperature of the radiation plates 111 and 121 constant, when reducing the temperature difference between the illuminated and non-illuminated areas IE and NIE on the optical element M, or when controlling the temperature of the radiation plates 111 and 121 so that the optical element M has the constant temperature. In addition, the cooling apparatus 1 can maintain the temperature of the optical element M constant even by maintaining the temperature of the radiation plate 111 constant, when the thermal load is almost constant, since the thermal load applied to the optical element M is equivalent to the heat amount removable by the radiation plate 111. Thus, it is possible to reduce positional variances of not only the reflective surfaces MR on the optical element M as the average temperature of the optical element M rises but also the optical element M as the temperatures of the support member MB rises.

While the instant embodiment uses the Peltier elements 113 and 123 to cool and heat the radiation plates 111 and 121, the radiation plates 111 and 121 may be provided with channels and low-temperature and high-temperature heat media may be flowed through the channels to maintain the radiation plates 111 and 121 at low and high temperatures, respectively. Thereby, the cooling and heating mechanisms 110 and 120 can be made smaller than those using the Peltier elements 113 and 123, although the radiation plates 111 and 121 have reduced temperature stabilities. A heater can be used for similar effects instead of the Peltier element 123.

When the cooling mechanism 110 cannot arrange the radiation plate 111 near and opposite to the illuminated area IE on the reflective surface MR of the optical element M, the radiation plate 111 may be arranged at a position that can cool the illuminated area IE through radiation, instead of arranging the radiation plate 111 near the illuminated area IE. For example, the radiation plate 111 can be held by the inside of the mirror barrel MA or the mirror barrel MA can serve as the radiation plate 111 by supplying a medium for adjusting the temperature of the mirror barrel MA. Here, FIG. 6 is a schematic view of principal part in one exemplary arrangement of a radiation plate in the cooling mechanism 110, when the radiation plate 111 cannot be located at a position opposite to and near the illuminated area IE on the reflective surface MR on the optical element M.

When the heat amount absorbed by the optical element M that receives the light is small, or when the sufficiently wide radiation plate 111 can be arranged at the side of the reflective surface MR on the optical element M, the cooling mechanism 110 does not have to be arranged near the rear surface MN of the reflective surface MR, since only the cooling mechanism 110 at the side of the reflective surface MR can absorb the necessary heat amount through radiation.

Even when the heating mechanism 120 arranges the radiation plate 121 having a small area near the illuminated area IE on the optical element M, the optical element M has a less variable surface shape, such as curvature, and less deteriorated imaging performance. In this case, the small heat amount provided by the radiation plate 121 to the optical element M can advantageously reduce the area of the radiation plate 121 in the cooling mechanism 120 to maintain the temperature of the optical element M at a desired temperature, and does not have to reduce the temperature greatly.

The mirror may be arbitrarily deformed by controlling temperatures of the radiation plates 111 and 121 and intentionally providing a temperature distribution on a surface of a mirror (i.e., optical element) and a resultant bending stress. Of course, a temperature at the backside of the radiation plate may also be controlled in that case.

Figure 7:
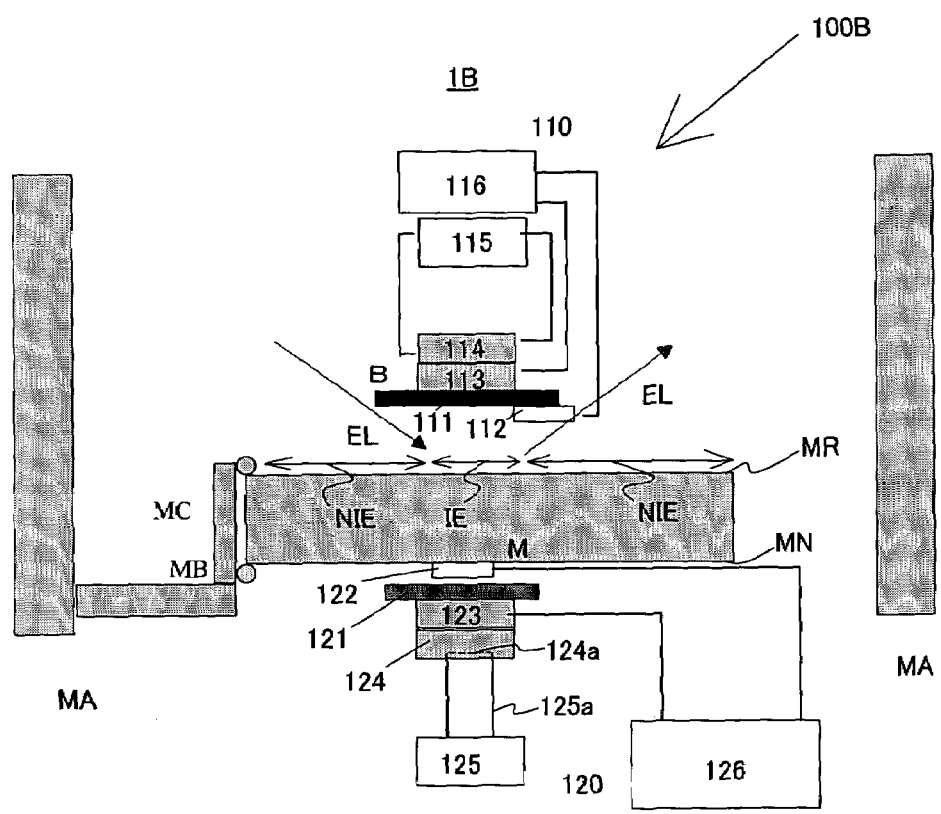
FIG. 7 is another variation of the cooling apparatus shown in FIG. 1.

Referring now to FIGS. 7 to 10, a description will be given of a cooling apparatus 1B as a variation of the cooling apparatus 1. The cooling apparatus 1B has a temperature variation mechanism 100B different from that in the cooling apparatus 1. More specifically, the cooling apparatus 1B absorbs the heat from the illuminated area IE of the optical element M, provides the heat to the rear surface MR on the optical element M, reducing a temperature difference between the reflective and rear surfaces MR and MN. Here, FIG. 7 is a schematic structure of the cooling apparatus 1B.

The cooling apparatus 1B includes, as best shown in FIG. 7, a cooling mechanism 110 and a heating mechanism 120 as a temperature variation mechanism 100B.

The cooling mechanism 110 is arranged so that it does not contact the optical element M or shield the exposure light EL. The cooling mechanism 110 absorbs the heat from the optical element M (particularly from the illuminated area IE) through radiation.

The heating mechanism 120 is arranged so that it does not contact the rear surface MN of the reflective surface MR on the optical element M, and provides the heat to the optical element M through radiation.

The radiation plate 121 is arranged apart by an interval from a region on the rear surface MN of the reflective surface MR on the optical element M corresponding to the illuminated area IE and provides the heat the optical element M through a radiation.

The cooling apparatus 1B uses the heating mechanism 120 to heat the rear surface MN of the reflective surface MR on the optical element (in particular, at a rear side of the illuminated area IE) and to reduce the temperature difference from the illuminated area IE on the optical element M. Thereby, the optical element M has a less variable surface shape, such as curvature, and less deteriorated imaging performance. As shown in FIG. 7, the cooling apparatus 1B uses the cooling mechanism 110 to cool the illuminated area IE on the optical element M, and to reduce the temperature difference between the illuminated and non-illuminated areas IE and NIE on the optical element M. Thereby, the optical element M has a less variable surface shape.

The cooling apparatus 1B uses the cooling mechanism 110 that cools the optical element M, to maintain, at the desired temperature, the temperature of the optical element M which rises with the exposure light EL. As a result, this cooling apparatus 1B improves positional stability of the optical element M and its optical performance.

The instant embodiment joints the detector 112 with the radiation plate 111 for the reflective surface MR on the optical element M to maintain constant the detected temperature of the radiation plate 111. In addition, the instant embodiment joints the detector 122 with the radiation plate 121 for the rear surface MN of the reflective surface MR on the optical element M to control the temperature of the radiation plate 121 so as to maintain constant the detected temperature of the optical element M. Alternatively, all of the radiation plates may be controlled so that their temperatures become constant, or all or part of the radiation plates may be controlled so that the temperature of the optical element becomes constant.

While the instant embodiment uses the Peltier elements 113 and 123 to cool and heat the radiation plates 111 and 121, the radiation plates 111 and 121 may be provided with channels and low-temperature and high-temperature heat media may be flowed through the channels to maintain the radiation plates 111 and 121 at low and high temperatures, respectively. Thereby, the cooling and heating mechanisms 110 and 120 can be made smaller than those using the Peltier elements 113 and 123, although the radiation plates 111 and 121 have reduced temperature stabilities. A heater can be used for similar effects instead of the Peltier element 123.

Figure 8:
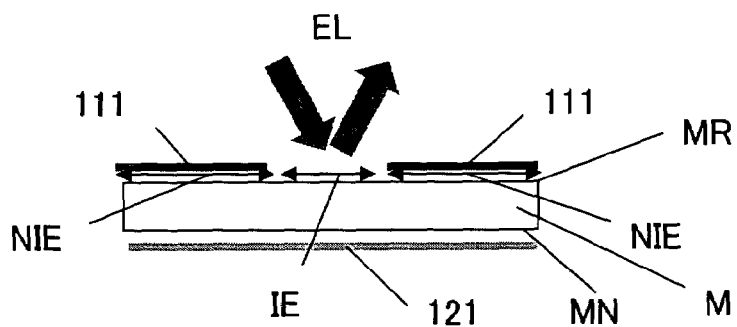
FIG. 8 is a schematic view of principal part in one exemplary arrangement of a radiation plate when the radiation plate cannot be located at a position opposite to and near an illuminated area on an optical element.

When the cooling mechanism 110 cannot arrange the radiation plate 111 near and opposite to the illuminated area IE of the optical element M, the radiation plate 111 may face the non-illuminated area NIE of the optical element M, as shown in FIG. 8. In this case, the heating mechanism 120 can arrange the radiation plate 121 over the entire surface MN of the reflective surface MR of the optical element M. This configuration prevents a temperature drop of the non-illuminated area NIE on the optical element, and reduces the temperature difference between the illuminated and non-illuminated areas IE and NIE on the optical element M. Here, FIG. 8 is a schematic view of principal part in one exemplary arrangement of the radiation plate 111 when the radiation plate 111 cannot be located at a position opposite to and near the illuminated area IE on the optical element M.

Figure 9:
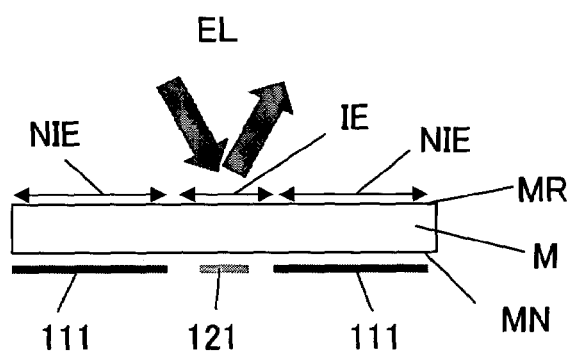
FIG. 9 is a schematic view of principal part in one exemplary arrangement of a radiation plate when the radiation plate cannot be located at a position opposite to and near an illuminated area on an optical element.
Figure 10:
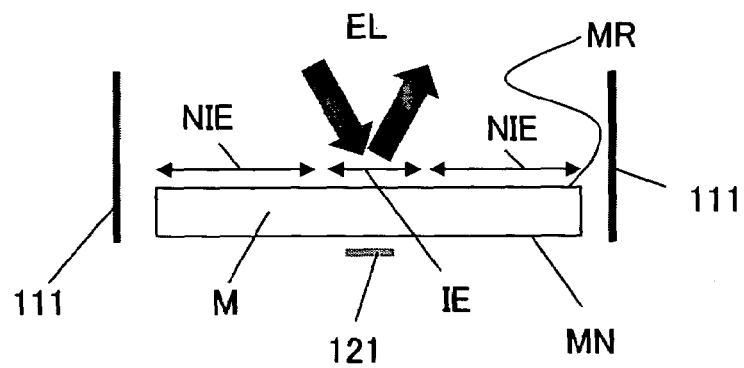
FIG. 10 is a schematic view of principal part in one exemplary arrangement of a radiation plate when the radiation plate cannot be located at a position opposite to and near an illuminated area on an optical element.

As shown in FIG. 9, the cooling mechanism 110 may arrange the radiation plate 111 at position outside a region on the rear surface MN of the reflective surface MR on the optical element M corresponding to the illuminated area IE. Moreover, as shown in FIG. 10, the cooling mechanism 110 may arrange the radiation plate 111 to enclose the optical element M. Here, FIGS. 9 and 10 are schematic views of principal part in one exemplary arrangement of the radiation plate 111 when the radiation plate 111 cannot be located at a position opposite to and near the illuminated area IE on the optical element M. The mirror may be deformed into a desired shape by varying temperatures of the radiation plates 111 and 121 at the backside of the mirror shown in FIG. 9 and/or by varying temperatures of the radiation plates 111 and 121.

As shown in FIGS. 8 to 10, when the radiation plate 111 is arranged at a position that can cool the illuminated area IE through radiation, instead of arranging the radiation plate 111 of the cooling mechanism 110 near and opposite to the illuminated area IE of the optical element M, a temperature difference with the illuminated area IE on the optical element M is reduced. Thereby, the optical element M has a less variable surface shape, such as curvature, and less deteriorated imaging performance.

In the cooling apparatus 1, 1A, and 1B, the surfaces of the radiation plate 111 and 121 opposite to the optical element M preferably have emissivity of 0.8 or greater for efficient cooling and heating. On the other hand, the surfaces of the radiation plate 111 and 121 that are not opposite to the optical element M preferably have emissivity of 0.2 or smaller so as not to affect the temperatures of neighboring members or thermally deform these members.

Figure 11:
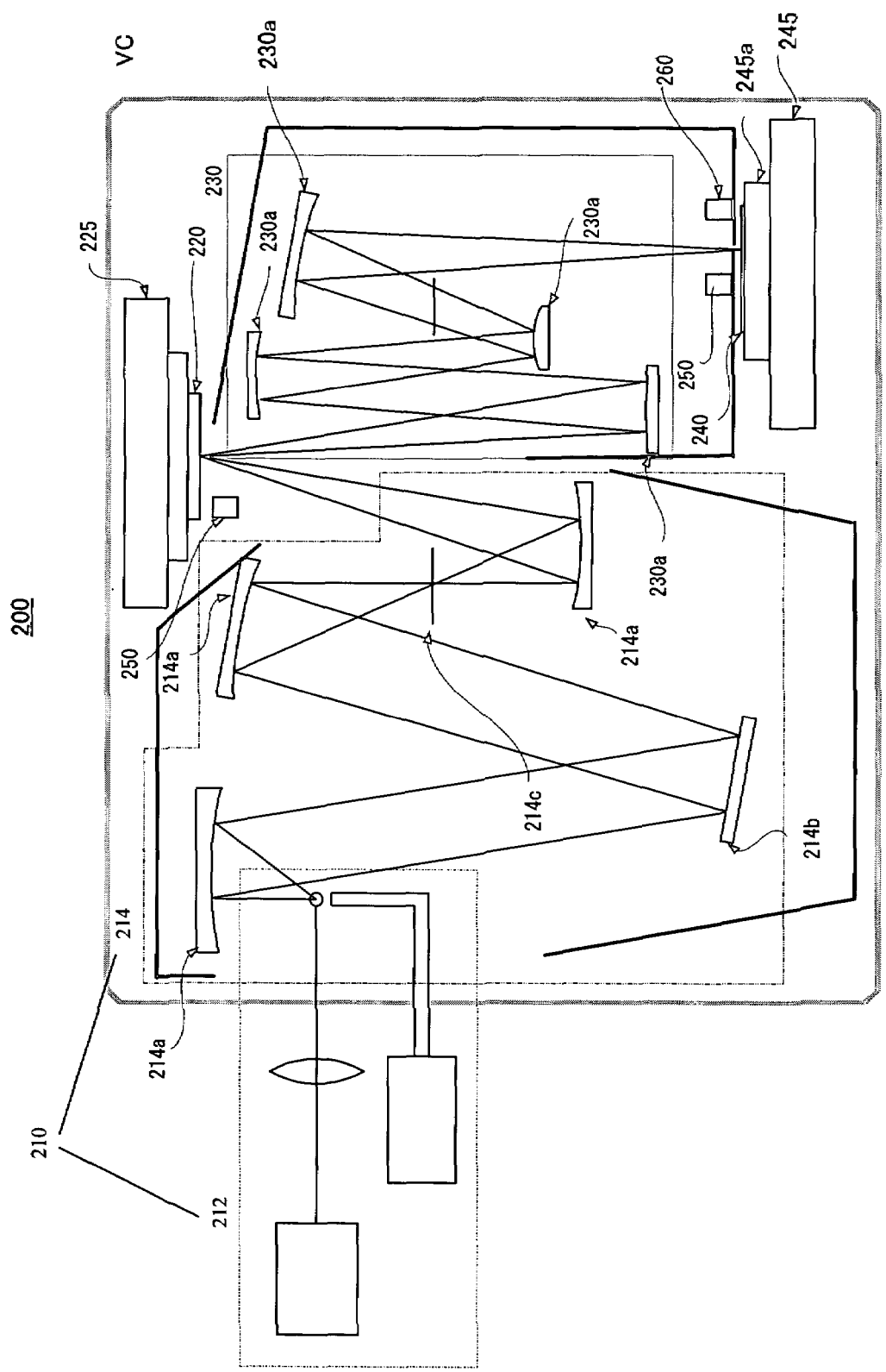
FIG. 11 is a schematic structure of an exposure apparatus of one embodiment according to the present invention.

Referring now to FIG. 11, a description will be given of an exemplary exposure apparatus 200 that applies the inventive cooling apparatus 1, 1A or 1B. Here, FIG. 11 shows a schematic structure of the exposure apparatus 200.

The exposure apparatus 200 uses, as illumination light for exposure, EUV light (with a wavelength of, e.g., 13.4 nm) to exposes onto an object 240 a circuit pattern formed on a mask 220, for example, in a step-and-repeat manner and step-and-scan manner. This exposure apparatus 200 is suitable for a lithography process less than submicron or quarter micron, and the present embodiment uses the step-and-scan exposure apparatus (also referred to as a "scanner") as an example. The "step-and-scan manner", as used herein, is an exposure method that exposes a mask pattern onto a wafer by continuously scanning the wafer relative to the mask, and by moving, after a shot of exposure, the wafer stepwise to the next exposure area to be shot. The "step-and-repeat manner" is another mode of exposure method that moves a wafer stepwise to an exposure area for the next shot every shot of cell projection onto the wafer.

Referring to FIG. 11, the exposure apparatus 200 includes an illumination apparatus 210, a mask 220, a mask stage 225 that mounts the mask 220, a projection optical system 230, an object to be exposed 240, a wafer stage 245 that mounts the object 240, and an alignment detection mechanism 250, and a focus position detection mechanism 260.

An optical path through which EUV light passes or an entire optical system is preferably maintained in a vacuum atmosphere VC due to low transmittance to air of the EUV light and a generation of contamination through a reaction with residual gas, such as polymer organic gas, as shown in FIG. 11.

The illumination apparatus 210 uses arc-shaped EUV light, for example, with a wavelength of 13.4 corresponding to an arc-shaped field of the projection optical system 230 to illuminate the mask 220, and includes an EUV light source 212 and illumination optical system 214.

The EUV light source 212 employs, for example, a laser plasma light source. It generates high temperature plasma by irradiating a pulsed laser beam with high intensity onto a target material in a vacuum chamber, and uses the EUV light, for example, with a wavelength of about 13 nm, which has been emitted from the plasma. The target material may use a metallic thin film, an inert gas, a liquid-drop, etc., and the target supply unit may use a gas jet and so on. The pulse laser is usually driven with a higher repetitive frequency, such as several kHz, for increased average intensity of radiated EUV light.

The illumination optical system 214 includes a condenser mirror 214a, and an optical integrator 214b. The condenser mirror 214a serves to collect the EUV light that is isotropically irradiated from the laser plasma. The optical integrator 214b serves to uniformly illuminate the mask 220 with a predetermined NA. The illumination optical system 214 further includes an aperture 214c to limit the illumination area to an arc shape at a position conjugate with the mask 520. An optical element in the illumination optical system 214 such as the condenser mirror 214a and optical integrator 214b may apply any one of the inventive cooling apparatuses 1, 1A and 1B. The cooling apparatus 1, 1A or 1B cools the condenser mirror 214a and optical integrator 214b, prevents deformation due to the thermal expansion for excellent imaging performance.

The mask 220 is a reflection mask that forms a circuit pattern or image to be transferred, and supported and driven by the mask stage 225. The diffracted light from the mask 220 is reflected by the projection optical system 230 and projected onto the object 540. The mask 220 and the object 240 are arranged optically conjugate with each other. The exposure apparatus 200 is a step-and-scan exposure apparatus, and projects a reduced size of the pattern on the mask 220 on the object 240 by scanning the mask 220 and the object 240.

The mask stage 225 supports the mask 220 and is connected to a moving mechanism (not shown). The mask stage 225 may use any structure known in the art. A moving mechanism (not shown) may include a linear motor etc., and drives the mask stage 225 at least in a direction X and moves the mask 220. The exposure apparatus 200 assigns the direction X to scan the mask 220 or the object 240, a direction Y perpendicular to the direction X, and a direction Z perpendicular to the mask 220 or the object 240.

The projection optical system 230 uses plural multilayer mirrors 230a to project a reduced size of a pattern formed on the mask 220 onto the object 240. The number of mirrors 230a is about four to six. For wide exposure area with the small number of mirrors, the mask 220 and object 240 are simultaneously scanned to transfer a wide area that is an arc-shaped area or ring field apart from the optical axis by a predetermined distance. The projection optical system 230 has a NA of about 0.2 to 0.3. An optical element in the projection optical system 230 such as the mirror 230a may apply any one of the inventive cooling apparatuses 1, 1A and 1B. The cooling apparatus 1, 1A or 1B cools the mirror 230a, prevents deformation due to the thermal expansion for excellent imaging performance.

The instant embodiment uses a wafer as the object to be exposed 240, but it may include a spherical semiconductor and liquid crystal plate and a wide range of other objects to be exposed. Photoresist is applied onto the object 240.

An object to be exposed 240 is held onto the wafer stage 245 by a wafer chuck 245a. The wafer stage 245 moves the object 240, for example, using a linear stage in XYZ directions. The mask 220 and the object 240 are synchronously scanned. The positions of the mask stage 225 and wafer stage 245 are monitored, for example, by a laser interferometer, and driven at a constant speed ratio.

The alignment detection mechanism 250 measures a positional relationship between the position of the mask 220 and the optical axis of the projection optical system 230, and a positional relationship between the position of the object 240 and the optical axis of the projection optical system 230, and sets positions and angles of the mask stage 225 and the wafer stage 245 so that a projected image of the mask 220 may be positioned in place on the object 240.

A focus detection optical system 260 measures a focus position in the direction Z on the object 240 surface, and control over a position and angle of the wafer stage 245 may always maintain the object 240 surface at an imaging position of the projection optical system 230 during exposure.

In exposure, the EUV light emitted from the illumination apparatus 210 illuminates the mask 220, and images a pattern formed on the mask 220 onto the object 240 surface. The instant embodiment uses an arc or ring shaped image plane, scans the mask 220 and object 240 at a speed ratio corresponding to a reduction ratio to expose the entire surface of the mask 220.

As the optical performance is sensitive to a surface shape of the optical element in the projection optical system in the exposure apparatus, the above cooling apparatus 1, 1A or 1B is often used for an optical element in the projection optical system, in particular, an optical element at a mask side that receives much light intensity. Of course, it may be used for the illumination optical system. In particular, the reflection optical element closest to a light source receives a large amount of light among the optical elements, generates the large absorbed heat value inevitably, and the absorbed heat value deforms the shape of the optical element. In order to prevent these problems, the above cooling apparatus 1, 1A or 1B prevents the temperature rise due to absorption of a large amount of light, and reduces a temperature difference in an a shape change of the optical element.

Figure 12:
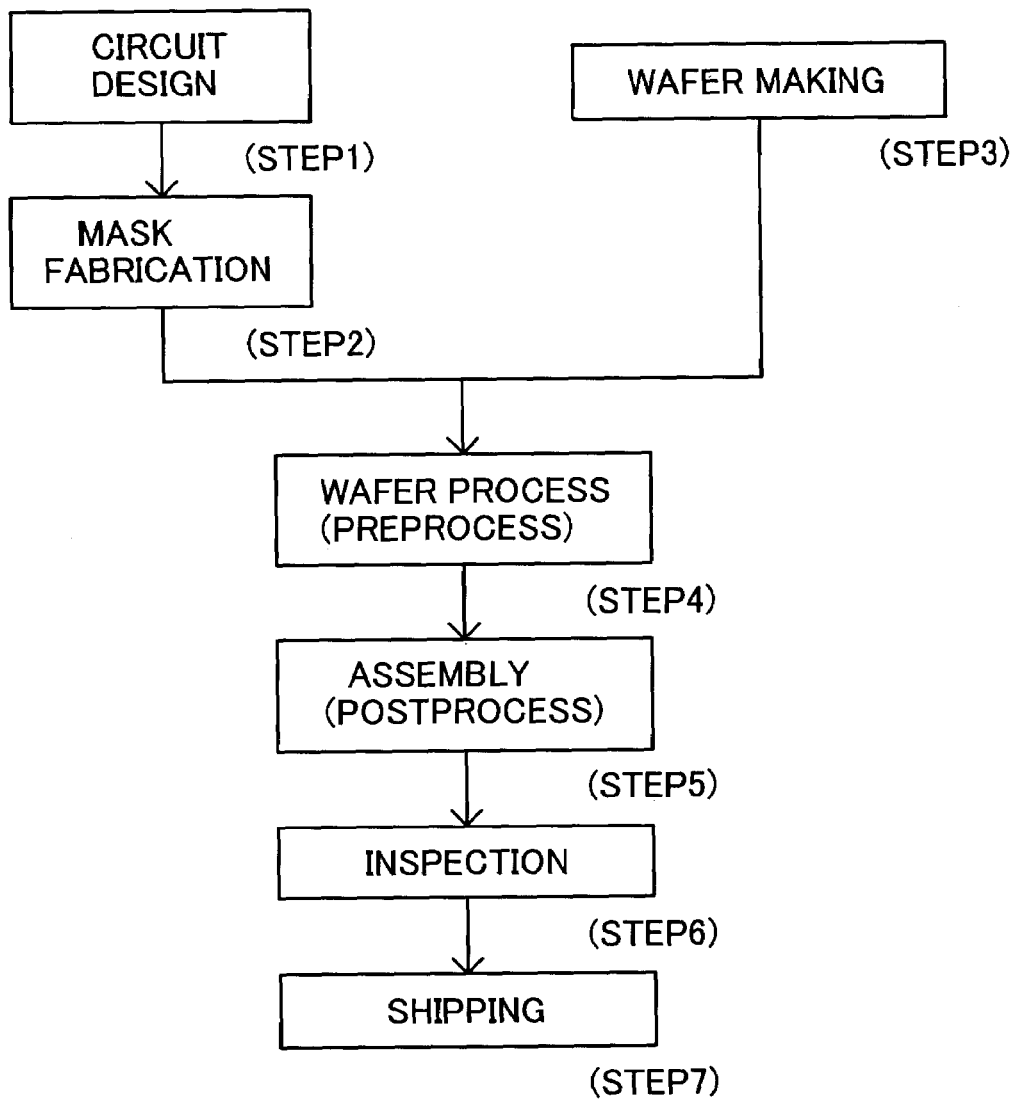
FIG. 12 is a flowchart for explaining a method for fabricating devices (semiconductor chips such as ICs, LSIs, and the like, LCDs, CCDs, etc.).
Figure 13:
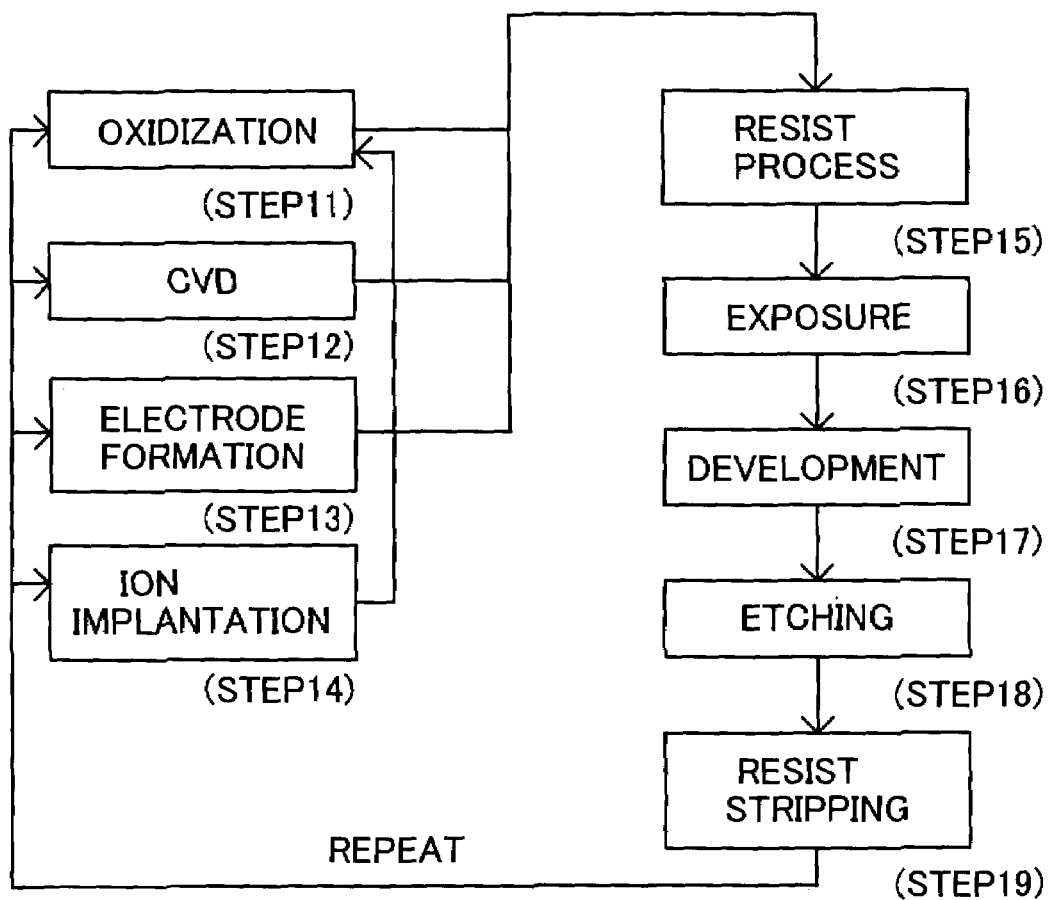
FIG. 13 is a detailed flowchart for Step 4 of wafer process shown in FIG. 12.
Figure 14:
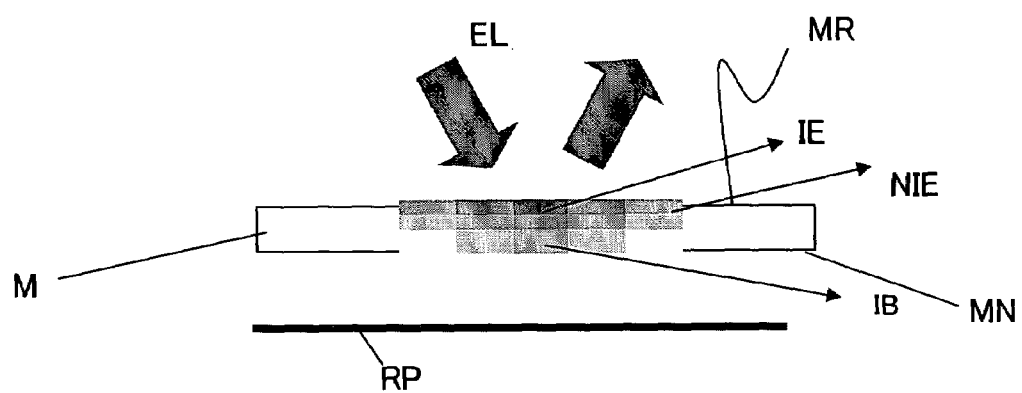
FIG. 14 is a schematic structure of one example of an exemplary mirror cooling method.
Figure 15:
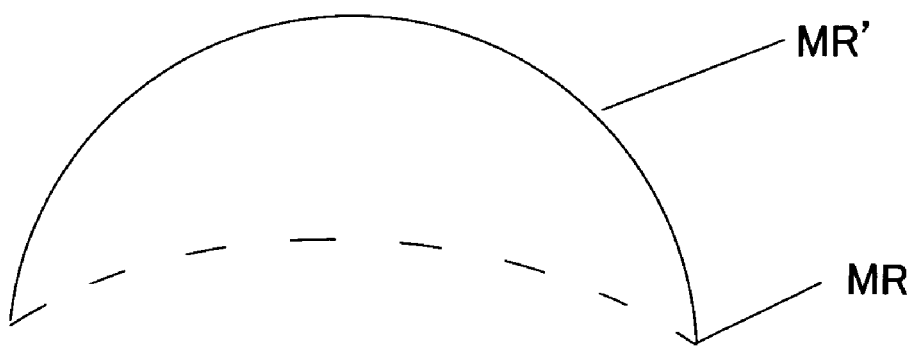
FIG. 15 is a schematic view showing a changing curvature of a mirror due to thermal deformation.

Referring to FIGS. 12 and 13, a description will now be given of an embodiment of a device fabricating method using the above exposure apparatus 200. FIG. 12 is a flowchart for explaining a fabrication of devices (i.e., semiconductor chips such as IC and LSI, LCDs, CCDs, etc.). Here, a description will be given of a fabrication of a semiconductor chip as an example. Step 1 (circuit design) designs a semiconductor device circuit. Step 2 (mask fabrication) forms a mask having a designed circuit pattern. Step 3 (wafer preparation) manufactures a wafer using materials such as silicon. Step 4 (wafer process), which is referred to as a pretreatment, forms actual circuitry on the wafer through photolithography using the mask and wafer. Step 5 (assembly), which is also referred to as a posttreatment, forms into a semiconductor chip the wafer formed in Step 4 and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

FIG. 13 is a detailed flowchart of the wafer process in Step 4. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation)

implants ion into the wafer. Step 15 (resist process) applies a photosensitive material onto the wafer. Step 16 (exposure) uses the exposure apparatus 200 to expose a circuit pattern on the mask onto the wafer. Step 17 (development) develops the exposed wafer. Step 18 (etching) etches parts other than a developed resist image. Step 19 (resist stripping) removes disused resist after etching. These steps are repeated, and multilayer circuit patterns are formed on the wafer. The device fabrication method of this embodiment may manufacture higher quality devices than the conventional one. Thus, the device fabrication method using the exposure apparatus 200, and the devices as finished goods also constitute one aspect of the present invention.

Further, the present invention is not limited to these preferred embodiments, and various variations and modifications may be made without departing from the scope of the present invention. For example, the inventive cooling apparatus is applicable to an optical element including a mask and a wafer for non-EUV, ultraviolet light with a wavelength of 200 nm or smaller, such as ArF excimer laser and $F_2$ excimer laser.

As discussed, the present invention can provide a cooling apparatus that improves an internal temperature distribution in an optical element, maintains the optical element at a reference temperature, and reduces a deformation of the optical element caused by a thermal expansion, which deterioration deteriorates imaging performance.

What is claimed is:

1. A cooling apparatus arranged in a vacuum or reduced pressure atmosphere for use with an optical element having an illuminated area onto which light is irradiated concave part, said cooling apparatus comprising:

a temperature variation mechanism that is arranged at the illuminated area side of the optical element and changes a temperature of the optical element using a radiation; and a radiation shielding part that faces a non-illuminated area other than the illuminated area of the optical element, and shields radiation to the non-illuminated area, wherein said radiation shielding part is a film formed on the non-illuminated area.

* * * * *